(12) United States Patent
Schreiber et al.

(10) Patent No.: US 7,398,495 B1
(45) Date of Patent: Jul. 8, 2008

(54) METHOD AND APPARATUS FOR CHARACTERIZING ARRAYS USING CELL-BASED TIMING ELEMENTS

(75) Inventors: Russell Schreiber, Austin, TX (US); David M. Newmark, Austin, TX (US); Joe Spector, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 351 days.

(21) Appl. No.: 11/398,832

(22) Filed: Apr. 6, 2006

(51) Int. Cl.
*G06F 17/50* (2006.01)
(52) U.S. Cl. ......................................................... 716/6
(58) Field of Classification Search ....................... None
See application file for complete search history.

(56) References Cited

U.S. PATENT DOCUMENTS 7,031,898 B2 * 4/2006 Jain et al. ..................... 703/14
7,315,992 B2 * 1/2008 Bhooshan et al. ............... 716/5
2003/0009318 A1 * 1/2003 Amatangelo et al. .......... 703/19

* cited by examiner

*Primary Examiner*—Leigh Marie Garbowski
(74) *Attorney, Agent, or Firm*—Williams, Morgan & Amerson

(57) ABSTRACT

The present invention provides a method and apparatus for characterizing a memory array. The method includes accessing information indicative of a transistor-level circuit design of a column of a memory array and determining at least one component of a cell representative of the column of the memory array based on the information indicative of the transistor-level circuit design and at least one timing rule for at least one signal associated with the column of the memory array. The method also includes determining at least one time delay associated with the cell based on the at least one component of at least one cell.

28 Claims, 4 Drawing Sheets

METHOD AND APPARATUS FOR CHARACTERIZING ARRAYS USING CELL-BASED TIMING ELEMENTS

BACKGROUND OF THE INVENTION

1. Field of the Invention

This invention relates generally to semiconductor devices, and, more particularly, to characterizing arrays using cell-based timing elements derived from a transistor-level design for a semiconductor device.

2. Description of the Related Art

Modern integrated circuits typically include tens of thousands of individual transistors. The precise number of transistors, as well as the interconnections between the transistors and/or other elements of the integrated circuit, may be specified in a circuit design. In principle, circuit designs could be tested by fabricating a device based on the circuit design and then directly testing the device to make sure that it performs in the expected manner. However, configuring a semiconductor fabrication facility to fabricate the device and then fabricating one or more devices for testing would cost an undesirably large amount of time and/or money. Accordingly, circuit designs are typically tested by simulating the timing of the circuit design.

One technique for simulating a circuit design determines the circuit timing by simulating the interaction of individual transistors in the circuit. This technique is known as "transistor-level simulation." The most popular program for transistor-level simulation is the Simulation Program with Integrated Circuit Emphasis (SPICE), which was developed at Berkeley starting in the 1970s, and is widely available in multiple forms today. Transistor-level simulation programs use a matrix-based technique for determining the circuit timing, which may make the transistor-level approach unwieldy and/or impractical for relatively large circuits, e.g. circuits that have in excess of about 10,000 transistors. Furthermore, transistor-level simulations typically require that the design engineer specify a particular path through the circuit design, e.g. in the form of a vector, in order to determine the time delay(s) associated with the path. Relatively large circuits may have numerous paths and the design engineer may have difficulty determining the correct path and, in some cases, may analyze an incorrect path. Some faster versions of transistor-level simulations may assume one or more heuristics in order to partition the circuit design.

Alternatively, the circuit design may be specified in terms of one or more cells. A cell-based circuit design specifies the properties of one or more cell elements and the interconnections between the cell elements. For example, the cell elements may include NAND gates, NOR gates, and the like. The cell-based circuit design may then specify the interconnections between the NAND gates and/or the NOR gates that are necessary to implement the logic and/or functions of the desired device. The particular arrangements of transistors that may be used to implement the cell elements are not typically specified by the cell-based circuit design. Instead, the transistor-level implementation is left undefined and design engineers are free to choose from among many possible transistor-level implementations of the cell elements.

Cell-based circuit designs may be simulated using static timing techniques. Static timing is a vectorless technique and so there is no need for the design engineer to specify a timing path through the circuit. Instead, a static timing simulator examines all possible paths through the circuit design. However, static timing cannot be applied directly to a transistor-level circuit design. Some static timing simulators include internal modules that attempt to convert transistor-level circuit designs to cell-based designs by modeling the transistor-level circuit design. However, when compared to cell-based static timing, these approaches typically have a low capacity and low control over the simulation. Furthermore, the models that are employed may impose a number of restrictions on the simulation. For example, the cells are only valid in context in which the cell is used.

Memory arrays such as synchronous random access memory (SRAM) arrays are particularly difficult to analyze because they include a very large number of individual transistors and the memory array circuits must satisfy very tight timing constraints. Transistor-level static timing tools typically have speed and capacity restrictions that reduce the accuracy of the timing analysis. Consequently, transistor-level static timing tools are generally considered to be too inaccurate to handle the bit cell and/or sense amplifier delays present in memory elements. Cell-based static timing tools are generally considered more accurate, but the efficacy of the cell-based static timing tools is limited by the characterization of the individual cells. In the case of memory arrays such as those found in microprocessor caches, defining the cells from a transistor-level design may be difficult or impossible because the extracted netlist is a flat transistor netlist that is not typically amenable to analysis by a cell-based static timing tool.

The parameters of the cells in a memory array, such as timing parameters, may be estimated by creating a critical path model and inserting extracted layout schematics as necessary. However, this technique is prone to error because circuit designers must estimate parasitics associated with some elements in the transistor-level design. Alternatively, the cells may be characterized by specifying a single path through the memory array, e.g., using a path pruning algorithm. This technique is also prone to error because the path pruning algorithm does not consider paths other than the specified path through the memory array. Consequently, the timing analysis of the memory array may be flawed if the circuit designer has not specified the correct (or optimal) path through the memory array. For example, performing the timing analysis based on cells defined using the path pruning algorithm may not detect portions (or corners) of the memory array that do not meet the strict timing margins for the memory array.

Columns within the memory array may also include elements that are not included in conventional models of cells that may be analyzed using conventional cell-based static timing techniques. For example, a column in a memory array typically includes sense amplifiers and read/write circuitry to read out (or write in) data stored in the bit cells of the column. Furthermore, conventional estimates of the properties of a cell allow the circuit designer to specify the order of particular events (such as the order of signals asserted on different lines), but do not typically allow the designer to define time delays between these events. For example, conventional techniques for characterizing cells do not specify setup/hold times of control signals (e.g., sense amplifier fire, read column select, right enable, midline precharge, sense amplifier precharge, word lines, and the like) in relation to one another. Thus, conventional cell-based static timing tools may not be able to ensure that the transistor-level design of a memory array will satisfy the required timing constraints.

SUMMARY OF THE INVENTION

The present invention is directed to addressing the effects of one or more of the problems set forth above. The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the present invention, a method is provided for characterizing a memory array. The method includes accessing information indicative of a transistor-level circuit design of a column of a memory array and determining at least one component of a cell representative of the column of the memory array based on the information indicative of the transistor-level circuit design and at least one timing rule for at least one signal associated with the column of the memory array. The method also includes determining at least one time delay associated with the cell based on the at least one component of at least one cell. In another embodiment of the present invention, an apparatus for characterizing the memory array is provided.

BRIEF DESCRIPTION OF THE DRAWINGS

The invention may be understood by reference to the following description taken in conjunction with the accompanying drawings, in which like reference numerals identify like elements, and in which.

Figure 1:
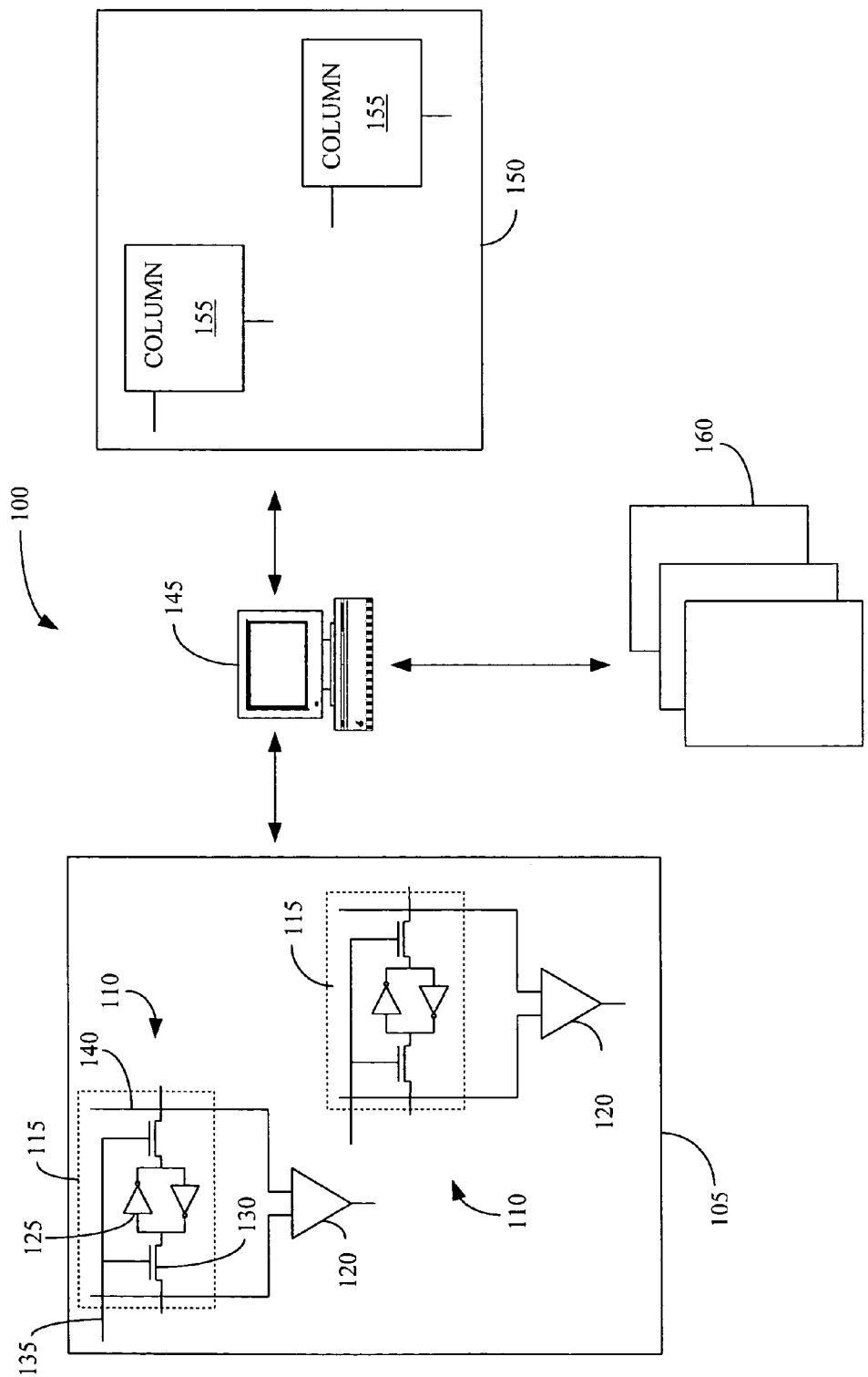
FIG. 1 conceptually illustrates one embodiment of a system for determining one or more timing delays associated with a circuit, in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 conceptually illustrates one embodiment of a system 100 for determining one or more timing delays associated with a circuit. In the illustrated embodiment, a transistor-level circuit design 105 of a memory array is provided. For example, a design engineer may create the transistor-level circuit design 105 using a computer-aided design tool (not shown), in which case the transistor-level circuit design 105 may be provided in the form of one or more files and/or databases provided by the computer-aided design tool and/or a circuit analysis tool. As used herein, the term "transistor-level circuit design" refers to circuit designs that utilize individual transistors as the primary design element in the circuit. However, persons of ordinary skill in the art having benefit of the present disclosure should appreciate that transistor-level circuit designs are not necessarily exclusively composed of individual transistors. In some embodiments, the transistor-level circuit design 105 may include other functional elements such as sense amplifiers. A typical transistor-level circuit design 105 of a memory array may include up to about 1,000,000 individual transistors that may be used to form a variety of functional elements and/or devices that may be used to implement the memory array.

In the illustrated embodiment, the transistor-level circuit design 105 of the memory array includes a plurality of memory columns 110. In the illustrated embodiment, each memory column 110 includes one or more bit cells 115 and one or more sense amplifiers 120, as well as other elements such as will be described in detail below. The bit cells 115 include two inverters 125 coupled in parallel between two transistors 130. The sense amplifiers 120, inverters 125, transistors 130, and any other elements present in the memory columns 110 may include one or more resistances (not shown) and one or more capacitances (not shown). For example, the inverters 125 may include one or more parasitic resistances and/or one or more parasitic capacitances.

The memory columns 110 may also include read/write circuitry. In the illustrated embodiment, the memory columns 110 include one or more word lines 135 that may be used to assert signals for storing information in the bit cells 115. One or more bit lines 140 may couple the bit cell 115 to the sense amplifiers 120 and may be used to readout information stored in the bit cells 115. In some embodiments, the memory columns 110 may also include additional lines that may be used to assert other signals to the memory column 110 or to receive signals asserted by portions of the memory column 110. Persons of ordinary skill in the art having benefit of the present disclosure should appreciate that the memory columns 110 shown in FIG. 1 are intended to be illustrative and are not intended to limit the present invention. The specific elements used to construct the memory columns 110, as well as the number of memory columns 110, are a matter of design choice and not material to the present invention.

Portions of the memory columns 110 are typically expected to satisfy predetermined timing rules. For example, after a signal has been asserted on the word line 135, a certain voltage differential should be allowed to build up between bit lines 140 before firing the sense amplifier 120 to lock in a measurement of the value stored in the bit cell 115. A timing rule may therefore be determined to specify a delay between the time a signal is asserted on the word line 135 and the time the sense amplifier 120 is fired. The timing rule may be determined to allow sufficient time for the desired voltage differential to develop between the bit lines 140. Persons of ordinary skill in the art having benefit of the present disclosure should appreciate that this particular timing rule is intended to be illustrative and not to limit the present invention. In alternative embodiments, any number of timing rules specifying any type of timing relationship associated with the memory columns 110 may be used. Furthermore, in various alternative embodiments, the timing rules may be determined in any manner, such as manual determination by a design engineer, determination by circuit design software, empirical determination, and the like.

The timing rules may be represented in the transistor-level circuit design 105 by incorporating additional elements. In one embodiment, the timing rules may be represented in the transistor-level circuit design 105 by incorporating voltage controlled voltage sources that include a time delay. For example, the timing rule that specifies the delay between the time a signal is asserted on the word lines 135 and the time the sense amplifier 120 may be fired may be represented by incorporating a voltage controlled voltage source having the appropriate time delay in the transistor-level circuit design 105, as will be discussed in detail below.

The system 100 also includes a processing unit 145. In the illustrated embodiment, the processing unit 145 is configured to access information indicative of the transistor-level circuit design 105 such as one or more of the files and/or databases provided by a computer-aided design tool used to create the transistor-level circuit design 105, information indicative of one or more voltage controlled voltage sources that have been incorporated into the transistor-level circuit design 105, and the like. For example, the processing unit 145 may access a transistor-level netlist file including information that characterizes the transistors as well as the connectivity between the transistors, a transistor-level detailed standard parasitic format (dspf) file including information that characterizes the resistances and/or capacitances between the transistors, and the like. Persons of ordinary skill in the art having benefit of the present disclosure should appreciate that the processing unit 145 may include any combination of hardware, firmware, and/or software. Furthermore, the processing unit 145 may be implemented a single device or may be distributed over multiple devices.

The processing unit 145 may use the accessed information (including information indicative of one or more timing rules) to determine properties or model parameters of one or more cells that are representative of the transistor-level circuit design 105. In the illustrated embodiment, the processing unit 145 uses the accessed information to form a cell-based circuit design 150 representative of the transistor-level circuit design 105. In contrast to the term "transistor-level circuit design," the term "cell-based circuit design" refers to circuit designs that utilize functional elements, i.e. cells, as the primary design element in the circuit. Cells may be implemented using different combinations of individual transistors and the particular combination of transistors used to implement the cell is typically a matter of design choice. For example, the processing unit 145 may form a cell-based circuit design 150 that includes cells 155 representative of the memory columns 110. However, persons of ordinary skill in the art having benefit of the present disclosure should appreciate that cell-based circuit designs are not necessarily exclusively composed of cells and may in some instances include individual transistors. Techniques for forming the cell-based circuit design 150 based upon the information indicative of the transistor-level circuit design 105 are described in U.S. patent application Ser. No. 11/334,220, filed Jan. 18, 2006, which is incorporated herein in its entirety by reference.

In the illustrated embodiment, the processing unit 145 creates one or more files 160 indicative of the cell-based circuit design 150. For example, the processing unit 145 may create one or more verilog netlist files including information that characterizes the cells as well as the connectivity to other cells, one or more cell-based dspf files that include information indicative of resistances and/or capacitances between the cells (which may be obtained from a parasitic analysis of the transistor-level circuit design 105 and/or the cell-based circuit design 150), one or more Synopsis Liberty format (lib) files that include information indicative of one or more models for each of the generated cells and/or delay information associated with the cells, and the like. In one embodiment, the processing unit 145 may store the files 160 in any location, including memory located within the processing unit 145 and/or an external memory device (not shown).

The processing unit 145 may determine one or more time delays associated with the transistor-level circuit design 105 using the cell-based circuit design 150 and/or the information stored in the files 160. For example, the files 160 may include one or more verilog netlist files, one or more cell-based dspf files, and one or more lib files that may be provided to a static timing analysis tool (not shown) implemented in the processing unit 145. The processing unit 145 may then determine one or more time delays associated with the transistor-level circuit design 105 using conventional static timing analysis techniques. These techniques are known to persons of ordinary skill in the art and in the interest of clarity only those aspects of static timing analyses that are relevant to the present invention will be discussed further herein.

The timing delays may be used to determine whether or not the transistor-level circuit design 105 (or portions thereof) satisfy the relevant timing rules. For example, the timing delays determined by the static timing analysis may indicate the order in which signals are asserted that various nodes of the transistor-level circuit design. By incorporating the time delays specified by the timing rules into the transistor-level circuit design 105, e.g., by including voltage controlled voltage sources in the transistor-level circuit design 105 as discussed above, static timing analysis tools may determine whether or not the timing rule has been satisfied by simply determining the order in which two signals are asserted, as will be discussed in detail below.

Figure 2:
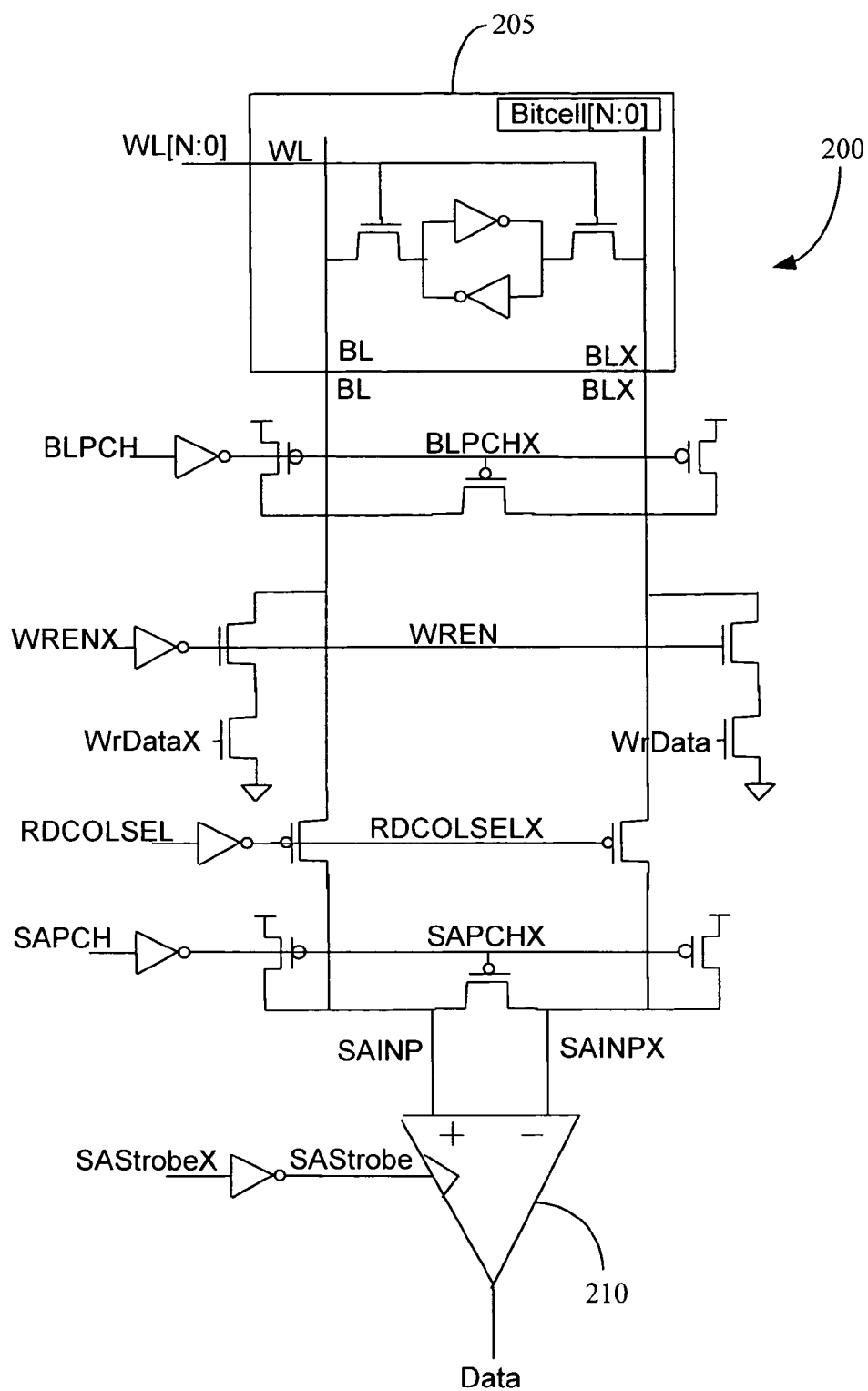
FIG. 2 conceptually illustrates one exemplary embodiment of a memory column, in accordance with the present invention.

FIG. 2 conceptually illustrates one exemplary embodiment of a memory column 200. In the illustrated embodiment, the memory column 200 includes a bit cell 205 (BitCell N:0) and a sense amplifier 210. A word line (WL) may be used to assert signals to the bit cell 205 and bit lines (BL, BLX) may be used to access the information stored in the bit cell 205. A bit line precharge signal (BLPCH) and an internal bit line precharge signal (BLPCHX) may be asserted to the bit lines (BL, BLX), respectively. Write enable signals (WREN, WRENX), read column select signals (RDCOLSEL, RDCOLSELX), sense amplifier precharge signals (SAPCH, SAPCHX), and the like may also be asserted to lines or nodes in the memory column 200. A sense amplifier strobe signal (SAStrobeX, SAStrobe) may be used to fire the sense amplifier 210 to read out the data stored in the bit cell 205, e.g., using the sense amplifier input signals (SAINP, SAINPX). Techniques for asserting the signals described above are known to persons of ordinary skill in the art and in the interest of clarity only those aspects of asserting the signals that are relevant to the present invention will be discussed further herein.

The signals described above may be asserted in accordance with one or more timing rules. For example, a timing rule may specify a timing delay between two of the signals at a particular percentage of the rail voltage. The timing rule may then specify a line on which a first signal is asserted as the data, a certain differential as the state node, and a second signal as a clock signal. The transistor-level representation of the memory column 200 may then be used to form a cell-based representation of the memory column 200, as discussed above. The timing rules may be represented in the transistor-level by incorporating voltage controlled voltage sources that may delay the signals in accordance with the timing rules. The resulting timing library for the memory column 200, as well as timing libraries for other partitioned cells in the memory array, can be used as input for a static timing tool run of the entire array.

Figure 3:
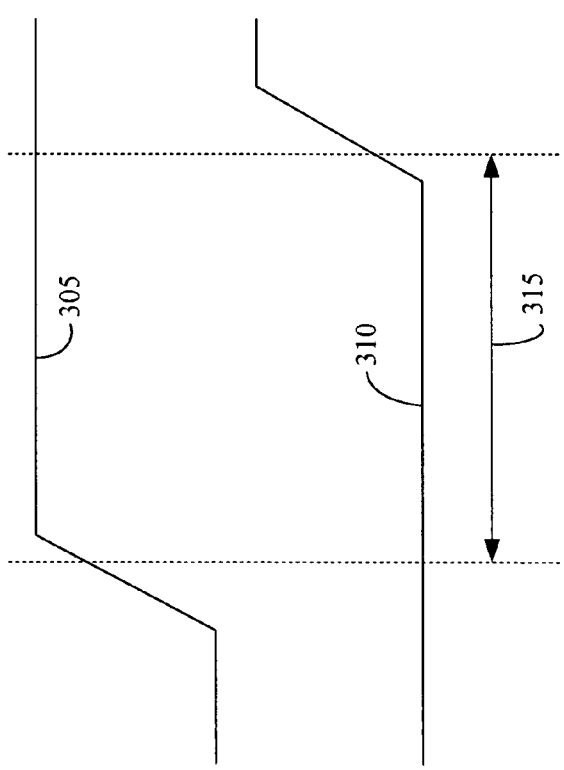
FIG. 3 conceptually illustrates one exemplary embodiment of a timing rule, in accordance with the present invention.

FIG. 3 conceptually illustrates one exemplary embodiment of a timing rule 300. In the illustrated embodiment, a voltage 305 associated with a bit line precharge (e.g., the bit line precharge BLPCHX shown in FIG. 2) is plotted as a function of time as it rises from approximately 0% of the rail voltage to approximately 100% of the rail voltage. A voltage 310 representative of a voltage asserted on a word line is also plotted as a function of time as it rises from approximately 0% of the rail voltage to approximately 100% of the rail voltage. The timing rule 300 indicates that the voltage 305 should rise to approximately 70% of the rail voltage at least a selected duration 315 before the voltage 310 rises to approximately 30% of the rail voltage. For example, the timing rule may indicate that the voltage 305 should rise to approximately 70% of the rail voltage at least approximately 20 picoseconds before the voltage 310 rises to approximately 30% of the rail voltage. This timing rule may be implemented using a voltage controlled voltage source.

Figure 4:
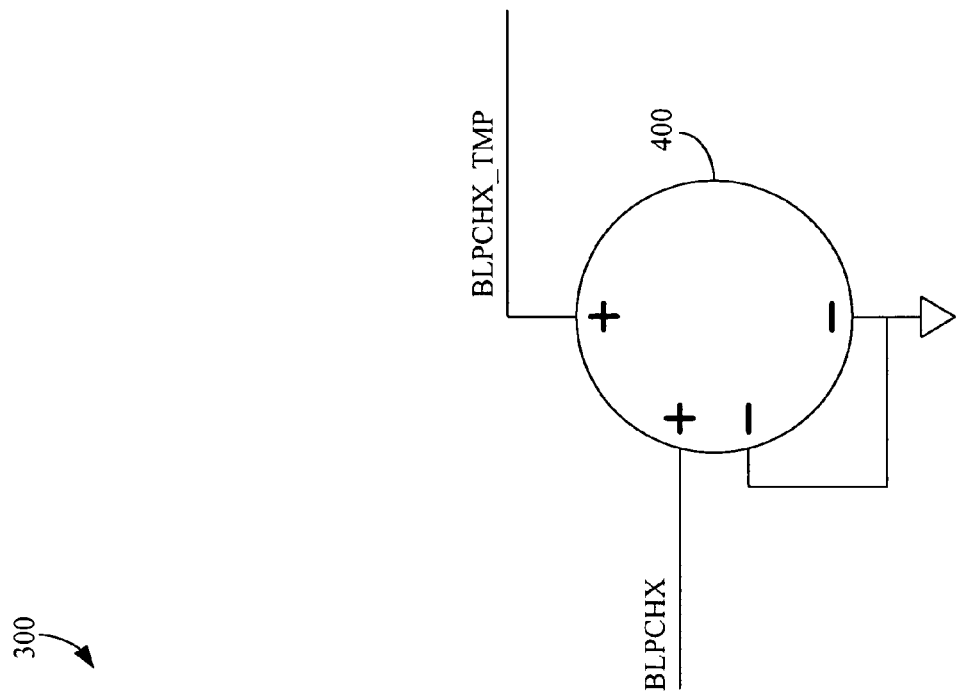
FIG. 4 conceptually illustrates one exemplary embodiment of a voltage controlled voltage source, in accordance with the present invention.

FIG. 4 conceptually illustrates one exemplary embodiment of a voltage controlled voltage source 400. In the illustrated embodiment, the voltage controlled voltage source 400 receives the bit line precharge voltage (BLPCHX) as an input and provides a delayed bit line precharge voltage (BLPCHX_TMP) as an output. For example, the delayed bit line precharge voltage may have the same magnitude as the bit line precharge voltage that may be delayed by approximately 20 picoseconds. In one embodiment, the voltage controlled voltage source 400 may be incorporated into a transistor-level circuit design. For example, the output of the voltage controlled voltage source 400 may be provided to various analysis tools instead of the bit line precharge signal. This may simplify timing analysis of the transistor-level circuit design. For example, a static timing tool may only need to verify that the delayed bit line precharge voltage provided by the voltage controlled voltage source rises to approximately 70% of the rail voltage before the word line voltage rises to approximately 30% of the rail voltage to verify that the timing rule has been satisfied.

Figure 5:
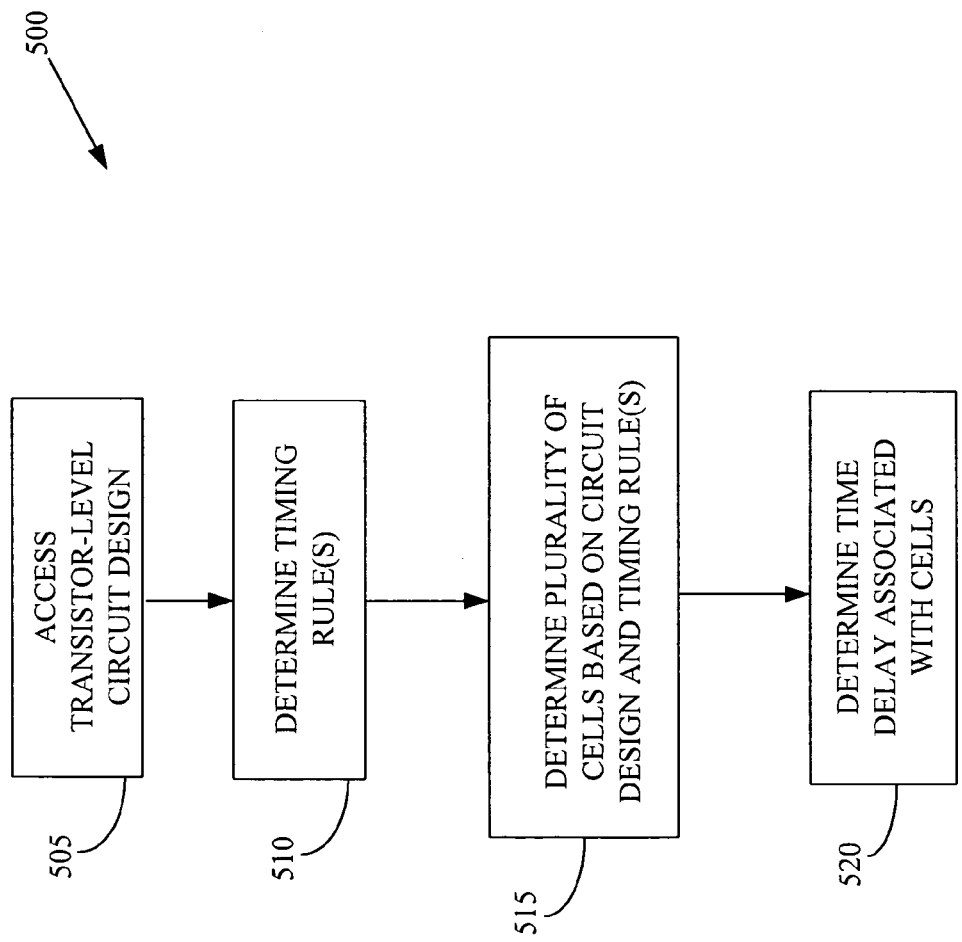
FIG. 5 conceptually illustrates one exemplary embodiment of a method of determining time delays associated with a transistor-level circuit design, in accordance with the present invention.

FIG. 5 conceptually illustrates one exemplary embodiment of a method 500 of determining time delays associated with a transistor-level circuit design. In the illustrated embodiment, information indicative of the transistor-level circuit design may be accessed (at 505). One or more timing rules may be determined (at 510). For example, timing rules associated with arcs in the transistor-level circuit design may be determined (at 510). A plurality of cells may be determined (at 515) based on the transistor-level circuit design and the timing rules. One or more time delays associated with the cells or the transistor-level circuit design may then be determined (at 520). For example, various configuration files and other information representative of the cell-based circuit design determined (at 515) based on the transistor-level circuit design and the timing rules may be provided to a static timing tool, such as PrimeTime, which may then determine (at 520) one or more timing delays, as well as other information, associated with the cell-based circuit design.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
accessing information indicative of a transistor-level circuit design of a column of a memory array;
determining at least one component of a cell representative of the column of the memory array based on the information indicative of the transistor-level circuit design and at least one timing rule for at least one signal associated with the column of the memory array; and
determining at least one time delay associated with the cell based on said at least one component of at least one cell.

2. The method of claim 1, wherein accessing the information indicative of the transistor-level circuit design comprises accessing information indicative of at least one bit cell, at least one sense amplifier, and read/write circuitry.

3. The method of claim 1, further comprising determining at least one timing rule for at least one control signal for said at least one column of the memory array.

4. The method of claim 1, further comprising determining at least one timing rule for at least one internal signal of said at least one column of the memory array.

5. The method of claim 1, further comprising determining said at least one timing rule based on at least one timing delay between at least two signals associated with said at least one column of the memory array.

6. The method of claim 5, wherein determining said at least one timing rule comprises determining at least one voltage controlled voltage source based on said at least one timing delay.

7. The method of claim 1, wherein determining said at least one component comprises determining at least one model parameter associated with said at least one cell based on the information indicative of the transistor-level circuit design and said at least one timing rule.

8. The method of claim 7, wherein determining said at least one model parameter comprises determining at least one of a resistance, a capacity, and a timing delay associated with said at least one cell.

9. The method of claim 1, wherein determining said at least one timing delay comprises determining a plurality of timing delays associated with the column.

10. The method of claim 9, further comprising determining a timing library associated with the cell based on the plurality of timing delays associated with the column.

11. The method of claim 10, further comprising determining a plurality of components of a plurality of cells representative of a plurality of columns of the memory array, determining at least one timing rule associated with each of the plurality of cells, and determining timing delays associated with the plurality of cells based on the plurality of components and the plurality of timing rules.

12. The method of claim 11, further comprising providing information indicative of at least one of the plurality of components of the plurality of cells, the timing rules associated with the plurality of cells, and the timing delays associated with the plurality of cells to a static timing tool.

13. The method of claim 12, further comprising performing a timing analysis of the memory array using the static timing tool and the provided information indicative of at least one of the components of the plurality of cells, the timing rules associates with the plurality of cells, and the timing delays associated with the plurality of cells.

14. An apparatus, comprising:
means for accessing information indicative of a transistor-level circuit design of a column of a memory array;
means for determining at least one component of a cell representative of the column of the memory array based on the information indicative of the transistor-level circuit design and at least one timing rule for at least one signal associated with the column of the memory array; and
means for determining at least one time delay associated with the cell based on said at least one component of at least one cell.

15. An apparatus, comprising:
a processing unit configured to:
access information indicative of a transistor-level circuit design of a column of a memory array;
determine at least one component of a cell representative of the column of the memory array based on the information indicative of the transistor-level circuit design and at least one timing rule for at least one signal associated with the column of the memory array; and
determine at least one time delay associated with the cell based on said at least one component of at least one cell.

16. The apparatus of claim 15, wherein the processing unit is configured to access information indicative of at least one bit cell, at least one sense amplifier, and read/write circuitry.

17. The apparatus of claim 15, wherein the processing unit is configured to determine at least one timing rule for at least one control signal for said at least one column of the memory array.

18. The apparatus of claim 15, wherein the processing unit is configured to determine at least one timing rule for at least one internal signal of said at least one column of the memory array.

19. The apparatus of claim 15, wherein the processing unit is configured to determine said at least one timing rule based on at least one timing delay between at least two signals associated with said at least one column of the memory array.

20. The apparatus of claim 19, wherein the processing unit is configured to determine at least one voltage controlled voltage source based on said at least one timing delay.

21. The apparatus of claim 15, wherein the processing unit is configured to determine at least one model parameter associated with said at least one cell based on the information indicative of the transistor-level circuit design and said at least one timing rule.

22. The apparatus of claim 21, wherein the processing unit is configured to determine at least one of a resistance, a capacity, and a timing delay associated with said at least one cell.

23. The apparatus of claim 15, wherein the processing unit is configured to determine a plurality of timing delays associated with the column.

24. The apparatus of claim 23, wherein the processing unit is configured to determine a timing library associated with the cell based on the plurality of timing delays associated with the column.

25. The apparatus of claim 24, wherein the processing unit is configured to determine a plurality of components of a plurality of cells representative of a plurality of columns of the memory array, determine at least one timing rule associated with each of the plurality of cells, and determine timing delays associated with the plurality of cells based on the plurality of components and the plurality of timing rules.

26. The apparatus of claim 25, further comprising at least one storage element, and wherein the processing unit is configured to store information indicative of at least one of the plurality of components of the plurality of cells, the timing rules associated with the plurality of cells, and the timing delays associated with the plurality of cells using said at least one storage element.

27. The apparatus of claim 25, further comprising at least one static timing tool, and wherein the processing unit is configured to provide information indicative of at least one of the plurality of components of the plurality of cells, the timing rules associated with the plurality of cells, and the timing delays associated with the plurality of cells to the static timing tool.

28. The apparatus of claim 27, wherein the static timing tool is configured to perform a timing analysis of the memory array using the static timing tool and the provided information indicative of at least one of the components of the plurality of cells, the timing rules associates with the plurality of cells, and the timing delays associated with the plurality of cells.

* * * * *